United States Patent
Yasuda et al.

(10) Patent No.: US 11,789,857 B2
(45) Date of Patent: Oct. 17, 2023

(54) DATA TRANSFER WITH CONTINUOUS WEIGHTED PPM DURATION SIGNAL

(71) Applicant: INTERNATIONAL BUSINESS MACHINES CORPORATION, Armonk, NY (US)

(72) Inventors: Takeo Yasuda, Nara (JP); Atsuya Okazaki, Setagaya-ku (JP)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 261 days.

(21) Appl. No.: 17/399,147

(22) Filed: Aug. 11, 2021

(65) Prior Publication Data

US 2023/0046980 A1    Feb. 16, 2023

(51) Int. Cl.
| | | |
|---|---|---|
| G06F 12/02 | (2006.01) | |
| G06F 7/544 | (2006.01) | |
| G11C 13/00 | (2006.01) | |
| H04L 27/10 | (2006.01) | |
| G06N 3/065 | (2023.01) | |

(52) U.S. Cl.
CPC .......... *G06F 12/023* (2013.01); *G06F 7/5443* (2013.01); *G06N 3/065* (2023.01); *G11C 13/003* (2013.01); *G11C 13/0028* (2013.01); *H04L 27/10* (2013.01); *G06F 2212/251* (2013.01)

(58) Field of Classification Search
CPC ................ G06F 12/023; G06F 7/5443; G06F 2212/251; G06F 3/06; G06N 3/065; G11C 13/0028; G11C 13/003; G11C 2213/79; G11C 13/0023; G11C 11/54; H04L 27/10
See application file for complete search history.

(56) References Cited

U.S. PATENT DOCUMENTS

| | | | |
|---|---|---|---|
| 7,106,793 B2 | 9/2006 | Spichale | |
| 10,176,425 B2* | 1/2019 | Yakopcic | ................. G06N 3/08 |
| 11,144,316 B1* | 10/2021 | Far | ......................... H03M 1/742 |
| 11,610,104 B1* | 3/2023 | Far | ......................... G06N 3/063 |
| 2017/0288924 A1 | 10/2017 | Kaizu et al. | |
| 2019/0244105 A1 | 8/2019 | Franca-Neto et al. | |

(Continued)

FOREIGN PATENT DOCUMENTS

| | | |
|---|---|---|
| CN | 101309092 A | 11/2008 |
| CN | 108471347 A | 8/2018 |

(Continued)

OTHER PUBLICATIONS

International Search Report from PCT/IB2022/057361 dated Nov. 28, 2022. (7 pages).

(Continued)

*Primary Examiner* — Jean B Corrielus
(74) *Attorney, Agent, or Firm* — Tutunjian & Bitetto, P.C.; Randy Emilio Tejeda

(57) ABSTRACT

A computer-implemented method for processing signals is provided including advantageously generating a temporally continuous weighted pulse position modulation (CW PPM) duration signal from an input analog signal, converting the CW PPM duration signal to a memory access signal, executing a multiply and accumulate (MAC) operation with the memory access signal, and advantageously generating the input analog signal from a result of the MAC operation by an activation function (AF).

25 Claims, 12 Drawing Sheets

(56) References Cited

U.S. PATENT DOCUMENTS

| | | |
|---|---|---|
| 2019/0332459 A1 | 10/2019 | Schie et al. |
| 2020/0218963 A1 | 7/2020 | Yasuda et al. |
| 2020/0293889 A1 | 9/2020 | Terasaki |
| 2020/0372335 A1 | 11/2020 | Ambrogio et al. |
| 2020/0382154 A1 | 12/2020 | Mangal et al. |
| 2021/0193204 A1 | 6/2021 | Jaiswal et al. |
| 2021/0349693 A1* | 11/2021 | Ito .......................... G06F 7/523 |

FOREIGN PATENT DOCUMENTS

| | | |
|---|---|---|
| CN | 109155666 A | 1/2019 |
| CN | 111191775 A | 5/2020 |
| CN | 210864805 U | 6/2020 |
| CN | 112106140 A | 12/2020 |
| JP | 6643626 B2 | 2/2020 |
| TW | I575900 B | 3/2017 |
| WO | 2002009381 A3 | 8/2002 |
| WO | 2020131397 A1 | 6/2020 |

OTHER PUBLICATIONS

Yin M, Ghovanloo M, "Using pulse width modulation for wireless transmission of neural signals in multichannel neural recording systems", IEEE transactions on neural systems and rehabilitation engineering. Jun. 2, 2009;17(4):354-63, pp. 1-27.

* cited by examiner

DATA TRANSFER WITH CONTINUOUS WEIGHTED PPM DURATION SIGNAL

BACKGROUND

The present invention relates generally to data transfer techniques, and more specifically, to data transfer with continuous weighted pulse position modulation (PPM) duration signals.

In electronics, modulation is the application of a controlling or altering influence on something. Modulation is also referred to as a variation in the pitch, strength, or tone of a frequency, like in the human voice. However, in terms of applications, modulation techniques are encountered in use for control of devices like direct current (DC) motors or light emitting diodes (LEDs). In cases such as these, the technique is called pulse width modulation (PWM).

Modulation refers to the ability to exert control over a device or system. Therefore, methods exist in a myriad of applications within the field of electronics. One of the more common uses for modulation as a control method is PWM. Extensive use of PWM is encountered due to its adaptive nature. PWM is a technique that mitigates the average amount of deliverable power of an applied electrical signal. Moreover, the process is achieved by effectively chopping up the signal into distinct parts. In terms of functional operation, PWM achieves this control by controlling the average current and voltage it delivers to the load. This method is accomplished by rapidly turning the switch between the load and the source, on and off. However, if on and off periods of the switch are compared, an increase in on-time versus off-time increases the total power supplied to the load.

Further, the PWM switching frequency needs to be high enough not to affect the load, yet the resulting waveform that the load perceives should also be smooth. Usually, the frequency in which the power supply must switch will vary extensively depending on the device and its application. For example, the switching has to be performed several times a minute and well into the tens or hundreds of kHz for PC power supplies and audio amplifiers. One of the advantages of using PWM is that power loss in the switching devices is substantially low. In fact, during the off phase of a switch, there is virtually no current. Also, during the on phase of a switch, there is practically no drop in voltage across the switch while transferring power to its load. Since power loss is a consequence of both voltage and current, this translates into virtually zero loss in power for PWM. As a result, PWM can be successively used for data transfer applications.

In particular, hardware neural network processor cores can use analog memory to achieve data transfer with PWM signals. The output of such neural network processor cores is analog data, although the signal level is the same as that of a digital signal. Data transfer with PWM signals enables analog data transfer without analog-to-digital (ADC) and digital-to-analog conversion (DAC). However, PWM signals require long periods to transfer large value data because the width of the duration corresponds to the value of the data. It is difficult to increase the performance (speed of operation) of a system unless the period of data transfer is shortened. Thus, other approaches are necessary to achieve efficient data transfer.

SUMMARY

In accordance with an embodiment, a computer-implemented method for processing signals is provided. The computer-implemented method includes generating a temporally continuous weighted pulse position modulation (CW PPM) duration signal from an input analog signal, converting the CW PPM duration signal to a memory access signal, executing a multiply and accumulate (MAC) operation with the memory access signal, and generating the input analog signal from a result of the MAC operation by an activation function (AF).

In accordance with another embodiment, a computer program product for processing signals is provided. The computer program product includes a computer readable storage medium having program instructions embodied therewith, the program instructions executable by a computer to cause the computer to generate a temporally continuous weighted pulse position modulation (CW PPM) duration signal from an input analog signal, convert the CW PPM duration signal to a memory access signal, execute a multiply and accumulate (MAC) operation with the memory access signal, and generate the input analog signal from a result of the MAC operation by an activation function (AF).

In accordance with yet another embodiment, a signal processing system for an analog neural network device is provided. The signal processing system includes a signal generator to generate a temporally continuous weighted pulse position modulation (CW PPM) duration signal from an input analog signal, a converter to convert the CW PPM duration signal to a memory access signal, a multiply and accumulate (MAC) operator for processing by accessing memory with the memory access signal, and an activation function (AF) operator to process a result of the MAC operator and to generate the input analog signal for the signal generator.

In accordance with another embodiment, an array structure is provided. The array structure includes a plurality of memory cells incorporated between a plurality of bit lines and a plurality of word lines, each memory cell including: a field effect transistor (FET) including a gate contact, a source contact, and a drain contact and a variable resistor having one end electrically connected to the drain contact of the FET and the other end electrically connected to a wordline of the plurality of wordlines, wherein a slope signal is supplied to the wordline and a window signal is supplied to the gate contact of the FET such that the slope signal and the window signal are combined to form a memory access signal derived from a continuous weighted pulse position modulation (CW PPM) duration signal.

In accordance with yet another embodiment, a method for constructing an array structure is provided. The method includes incorporating a plurality of memory cells between a plurality of bit lines and a plurality of word lines, each memory cell including: a field effect transistor (FET) including a gate contact, a source contact, and a drain contact and a variable resistor having one end electrically connected to the drain contact of the FET and the other end electrically connected to a wordline of the plurality of wordlines, and supplying a slope signal to the wordline and a window signal to the gate contact of the FET such that the slope signal and the window signal are combined to form a memory access signal derived from a continuous weighted pulse position modulation (CW PPM) duration signal.

The advantages of the present invention include providing efficient data transfer for large data. The advantages of the present invention further include more efficient central processing unit (CPU) utilization and more efficient input/output (I/O) bandwidth utilization due to the efficient data transfer for large data. Further advantages include higher quality, reduced cost, clearer scope, faster performance, fewer application errors, and fewer data errors.

In one preferred aspect, the CW PPM duration signal is transferred from a pre-neuron to a post-neuron through a network router.

In another preferred aspect, the CW PPM duration signal is an exponential decay weighted signal.

In yet another preferred aspect, the exponential decay weighted signal is based on a time from when a synchronization pulse is added just before the exponential decay weighted signal.

In yet another preferred aspect, the steps are repeated by using the CW PPM duration signal generated from the input analog value which is an output of the MAC and the AF.

In yet another preferred aspect, the CW PPM duration signal allows for data transfer by shortening a duration pulse.

In yet another preferred aspect, the memory access signal is separated into a slope signal and a window signal.

In yet another preferred aspect, the slope signal and the window signal determine a memory access amount for controlling data transfer.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for employing continuous weight to the location of duration pulses to shorten the duration pulse. The duration pulse can be shortened by converting the continuous weighted pulse position modulation (PPM) signal into memory access signals according to the added continuous weight. After accessing the analog memory with converted signals, multiply and accumulate (MAC) operation is achieved with a memory array and a current-to-voltage converter. The result of the MAC is sent to an activation function (AF) and a duration signal pulse is generated. The duration signal pulse is converted to a continuous weighted PPM duration signal.

PPM is a signal modulation technique that allows computers to share data by measuring the time each data packet takes to reach the computer. PPM works by sending electrical, electromagnetic, or optical pulses to a computer or other device in order to communicate data. PPM requires both devices to be synchronized to the same clock so that when a series of pulses is sent, the device decodes the information based on when the pulses were broadcasted. PPM can be used herein to advantageously transfer large amounts of data.

The ability to act quickly and decisively in today's increasingly competitive marketplace is important to the success of organizations. The volume of information that is available to corporations is rapidly increasing and frequently overwhelming. Those organizations that will effectively and efficiently manage these massive volumes of data, and use the information to make business decisions, will realize a competitive advantage in the marketplace. Such competitive advantage can be achieved by using the continuous weighted (CW) PPM duration scheme presented herein, which transfers large volumes of data quickly and efficiently.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity.

This is not intended to be interpreted as a limitation of any particular embodiment, or illustration, or scope of the claims.

Figure 1:
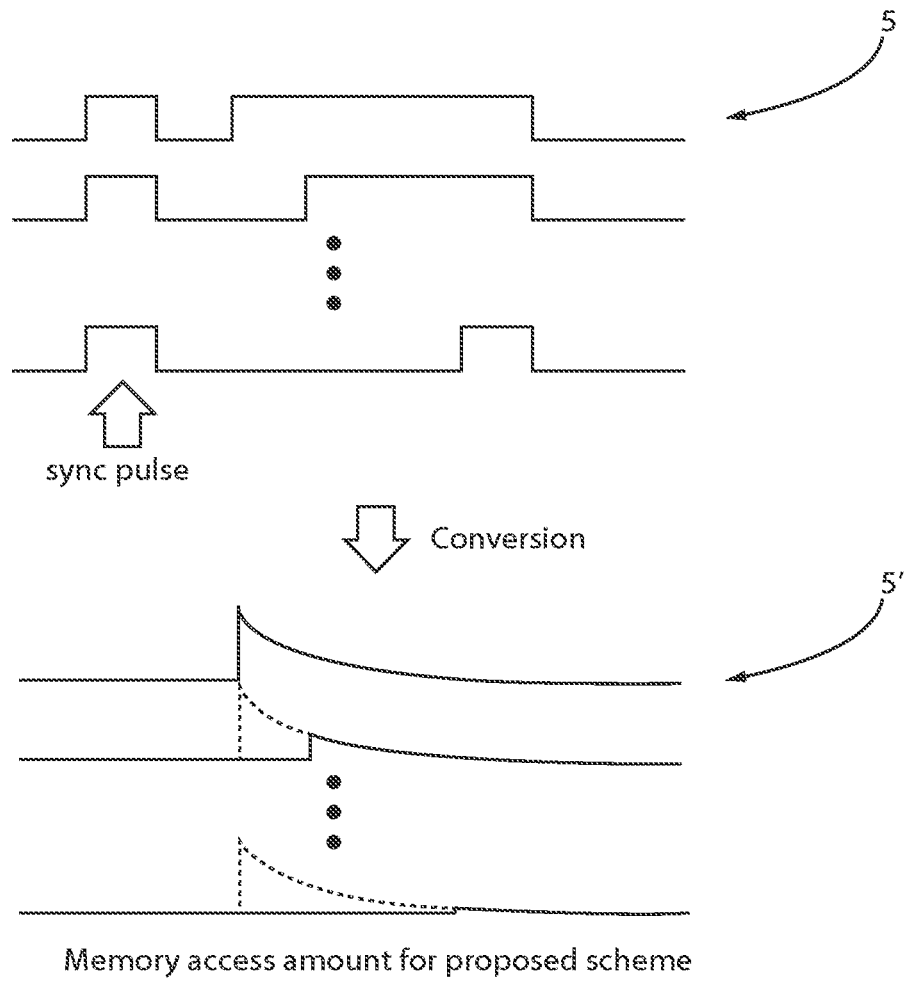
FIG. 1 illustrates an exemplary continuous weighted pulse position modulation (PPM) duration scheme, in accordance with an embodiment of the present invention.

FIG. 1 illustrates an exemplary continuous weighted pulse position modulation (PPM) duration scheme, in accordance with an embodiment of the present invention.

Waveforms 5 show the input of the duration-to-access signal conversion, whereas waveforms 5' show the output of the duration-to-access signal conversion. The exemplary embodiments convert the waveforms 5 into a memory access amount. The maximum duration data period for both waveforms is reduced from 2' to (ln 2'+α) or less.

Figure 2:
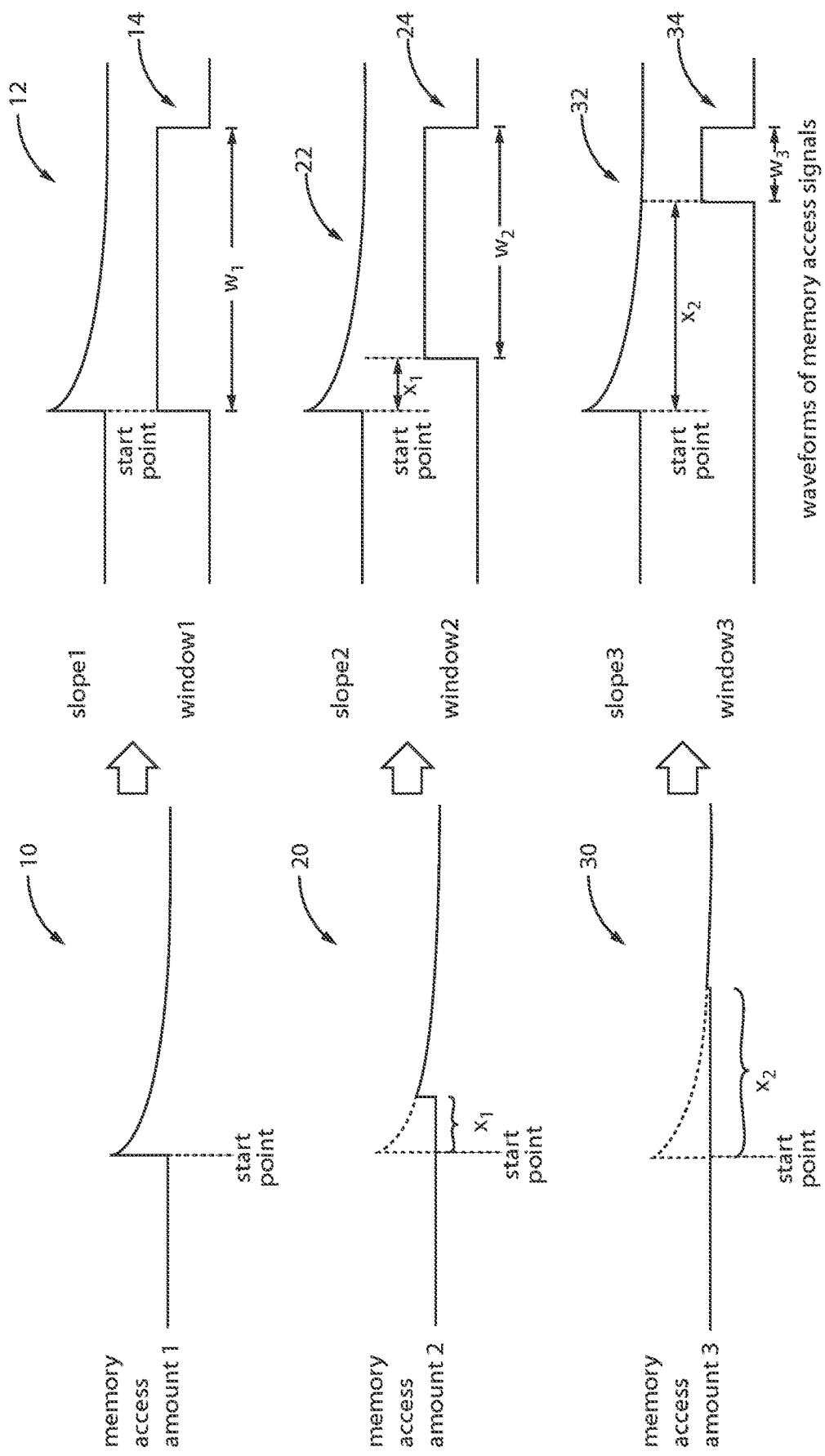
FIG. 2 illustrates exemplary memory access signals for memory access amount, in accordance with an embodiment of the present invention.

FIG. 2 illustrates exemplary memory access signals for memory access amount, in accordance with an embodiment of the present invention.

The memory access amount can be advantageously separated into a "slope" signal and a "window" signal. The first memory access amount signal 10 can be separated into a slope signal 12 and a window signal 14. The window signal 14 can have a width of $w_1$. The second memory access amount signal 20 can be separated into a slope signal 22 and a window signal 24. The window signal 24 can have a width of $w_2$, where $w_2 < w_1$. The third memory access amount signal 30 can be separated into a slope signal 32 and a window signal 34. The window signal 34 can have a width of $w_3$, where $w_3 < w_2 < w_1$.

This correspondence can be explained with the following descriptions. The memory access amount signal 10 (memory access amount 1) can be an exponentially decayed signal with no delay from start point timing. The memory access amount signal 20 (memory access amount 2) can be an exponentially decayed signal with delay $x_1$ from start point timing, whereas the memory access amount signal 30 (memory access amount 3) can be the same signal with delay $x_2$ from start point timing. The memory access amount can be controlled by the active waveform period of the exponentially decayed signal. The $x_i$ determines the active waveform period $w_{i+1}$ because, in this case, $x_i$ plus $w_{i+1}$ is constant. Therefore, the memory access amount can be determined by start point timing of exponentially decayed signal and active waveform period ($w_{i+1}$). Thus, data transfer rates can be controlled by the CW PPM duration signal.

PPM is an analog modulating scheme in which the amplitude and width of the pulses are kept constant, while the position of each pulse, with reference to the position of a reference pulse, varies according to the instantaneous sampled value of the message signal. The transmitter has to send synchronizing pulses (or sync pulses) to keep the transmitter and receiver in synchronism. These sync pulses help maintain the position of the pulses. Pulse position modulation is done in accordance with the pulse width modulated signal. Each trailing of the pulse width modulated signal becomes the starting point for pulses in the PPM signal. Thus, the position of these pulses is proportional to the width of the PWM pulses.

Figure 3:
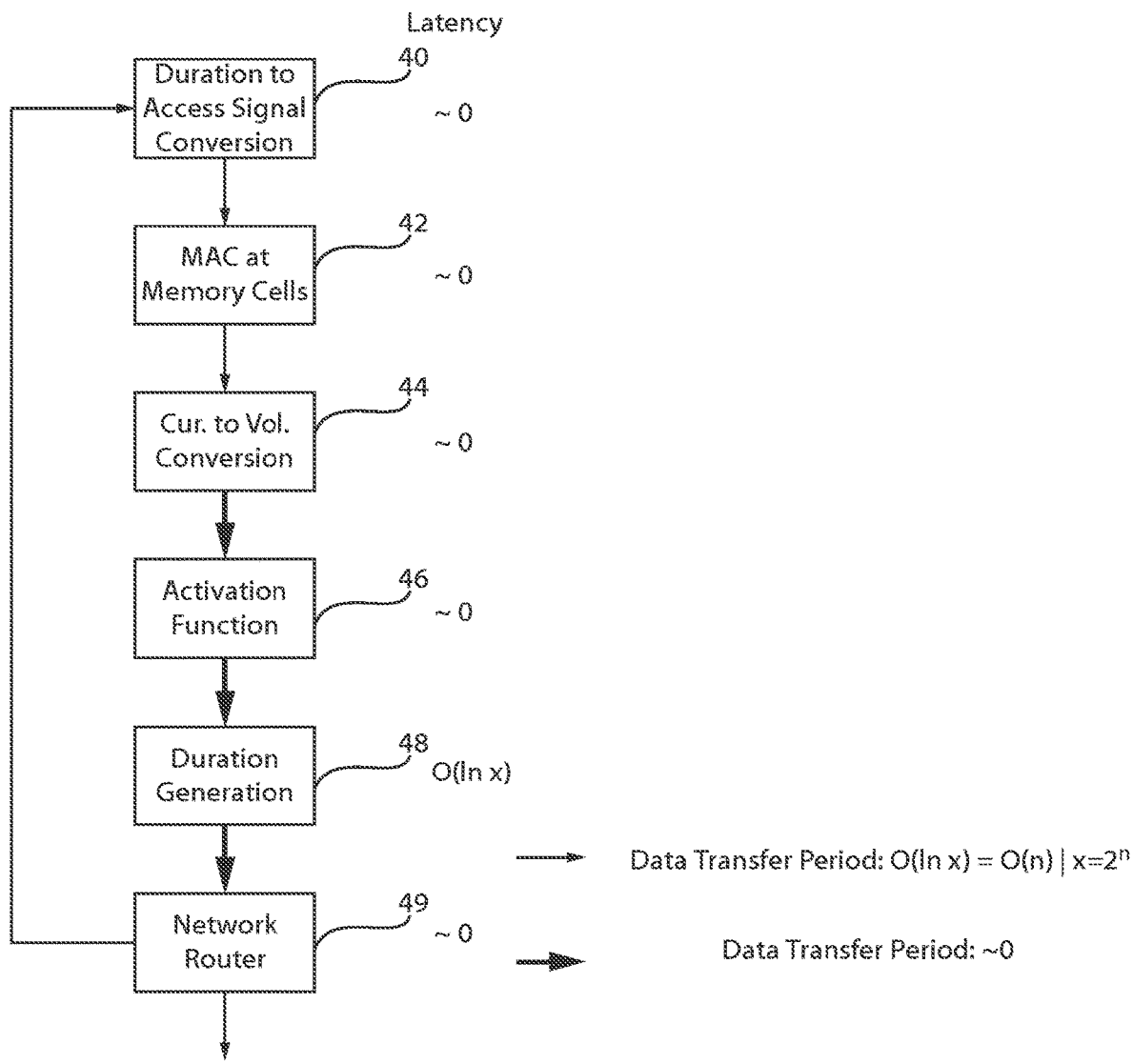
FIG. 3 is a block/flow diagram of an exemplary data process flow for the continuous weighted PPM duration scheme, in accordance with an embodiment of the present invention.

FIG. 3 is a block/flow diagram of an exemplary data process flow for the continuous weighted PPM duration scheme, in accordance with an embodiment of the present invention.

At block 40, duration-to-access signal conversion takes place.

At block 42, multiply-accumulate (MAC) operation takes place at the memory cells.

At block 44, current-to-voltage conversion takes place.

At block 46, an activation function is implemented.

At block 48, duration generation is performed.

At block 49, a network router is advantageously employed.

Figure 4:
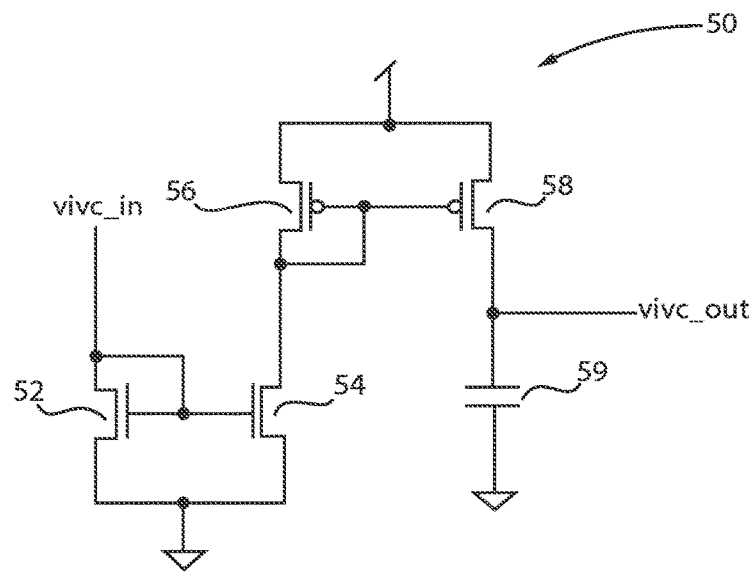
FIG. 4 is an exemplary current-to-voltage converter, in accordance with an embodiment of the present invention.

FIG. 4 is an exemplary current-to-voltage converter, in accordance with an embodiment of the present invention.

The current-to-voltage converter 50 includes a first field effect transistor (FET) 52 a second FET 54, where the second FET 54 is connected to a third FET 56. The third FET 56 is connected to a fourth FET 58, which, in turn, is connected to a capacitor 59. The third FET 56 and the fourth FET 58 can be p-type metal oxide semiconductor (PMOS) transistors, whereas the first FET 52 and the second FET 54 can be n-type metal oxide semiconductor (NMOS) transistors. One skilled in the art can contemplate a plurality of different FET configurations to achieve current-to-voltage conversion.

Figure 5:
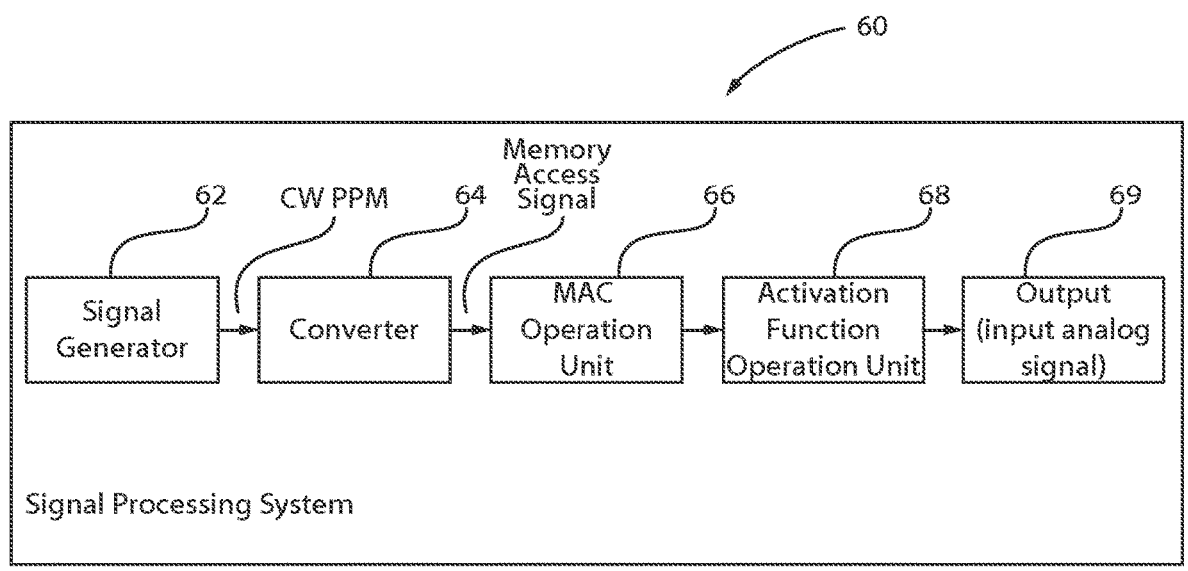
FIG. 5 is an exemplary signal processing system for the continuous weighted PPM duration scheme, in accordance with an embodiment of the present invention.

FIG. 5 is an exemplary signal processing system for the continuous weighted PPM duration scheme, in accordance with an embodiment of the present invention.

The signal processing system 60 can advantageously include a signal generator 62, a converter 64, a MAC operation unit 66, an activation function operation unit 68, and an output 69. Thus, the signal processing system 60 for an analog neural network device can include a signal generator 62 to generate a temporally continuous weighted pulse position modulation (CW PPM) duration signal from input analog signal, a converter 64 to convert the CW PPM duration signal to a memory access signal, a multiply and accumulate (MAC) operation unit 66 for processing by accessing memory with the above memory access signal, and an activation function (AF) operation unit 68 to process the result 69 of the MAC operation unit and to generate the input analog signal to the signal generator.

Figure 6:
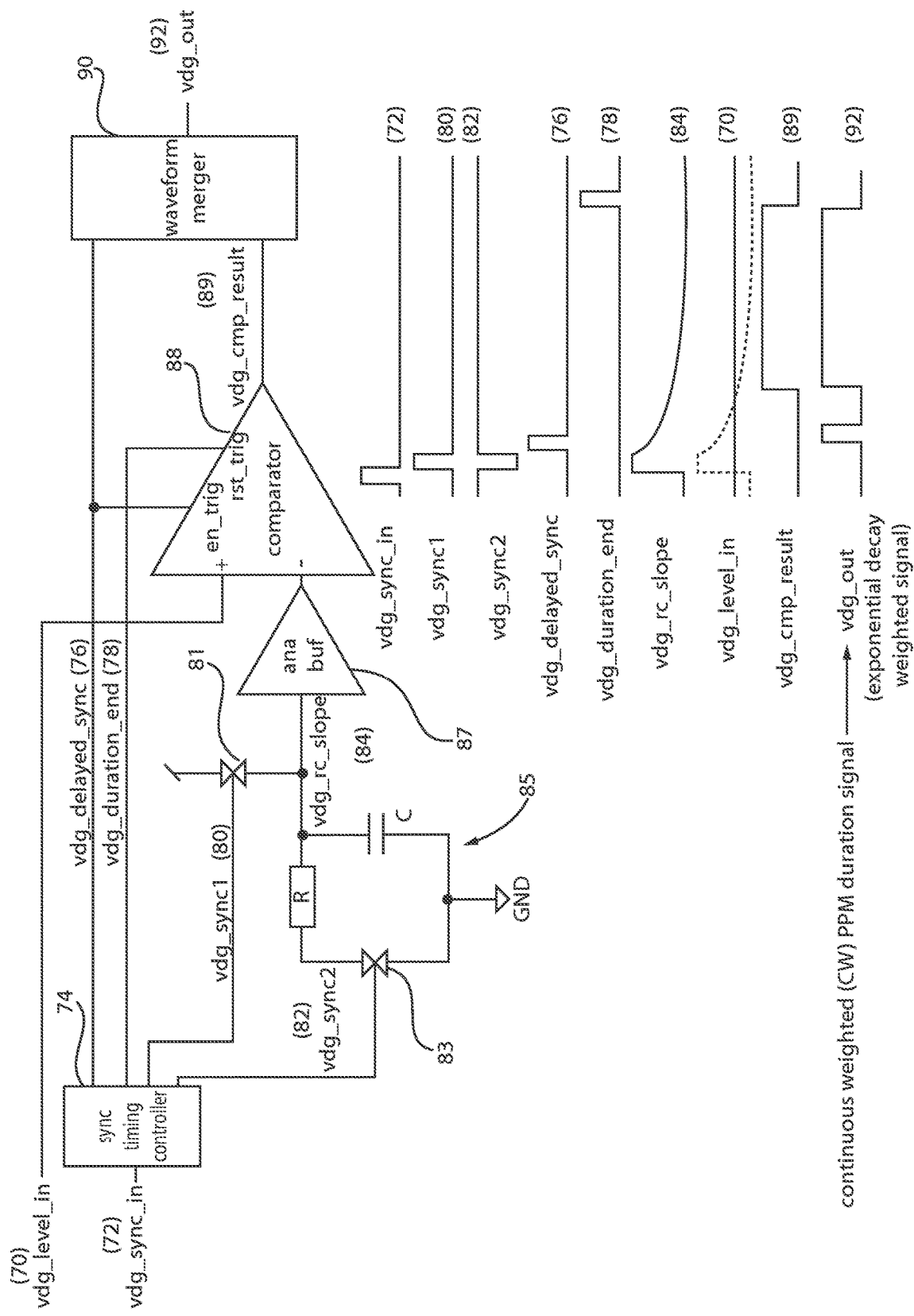
FIG. 6 is an exemplary continuous weighted PPM duration signal generator, in accordance with an embodiment of the present invention.

FIG. 6 is an exemplary continuous weighted PPM duration signal generator, in accordance with an embodiment of the present invention.

An input signal vdg_level_in (70) is received by the positive terminal of the comparator 88. The operational amplifier in the form of a comparator 88 can be advantageously used to find the value of input voltage larger than a specified range. In other embodiments, the operational amplifier in the form of a comparator 88 can be used to advantageously find the value of positive and negative voltages if the certain value of reference voltage source is linked with the inverting input.

A signal vdg_sync_in (72) is received by a sync timing controller 74. The sync timing controller 74 outputs 4 signals. The first signal, vdg_delayed_sync (76), is received by a waveform merger 90. The vdg_delayed_sync (76) is also supplied to the comparator 88 as en_trig input which triggers enablement of the comparator 88. The second signal, vdg_duration_end (78), is supplied to the comparator 88 as reset trigger signal (rst_trig) which resets the output of the comparator 88 vdg_cmp_result (89) to zero. The third signal, vdg_sync1 (80) is supplied to a transfer gate (T-gate) 81 which works as ON/OFF switch with supplied signal. The fourth signal, vdg_sync2 (82) is received by a T-gate 83 within a circuit configuration 85 having a resistor "R" and a capacitor "C." The output of the circuit configuration 85 is signal vdg_rc_slope (84) supplied to an analog buffer 87 connected to the negative terminal of the comparator 88. The comparator 88 advantageously outputs a comparison result as signal vdg_cmp_result (89). The signal vdg_cmp_result (89) is provided to the waveform merger 90 with the signal vdg_delayed_sync (76).

The signal vdg_rc_slope (84) supplied to the negative terminal of the comparator 88 is exponentially decayed signal and the input signal vdg_level_in (70) supplied to the positive terminal of the comparator 88 is analog level signal. The comparator 88 compares these signals and advantageously provide the output signal vdg_out (92). The continuous weighted PPM duration signal (92) which is the output of the waveform merger 90 is illustrated at the bottom right-hand corner.

Figure 7:
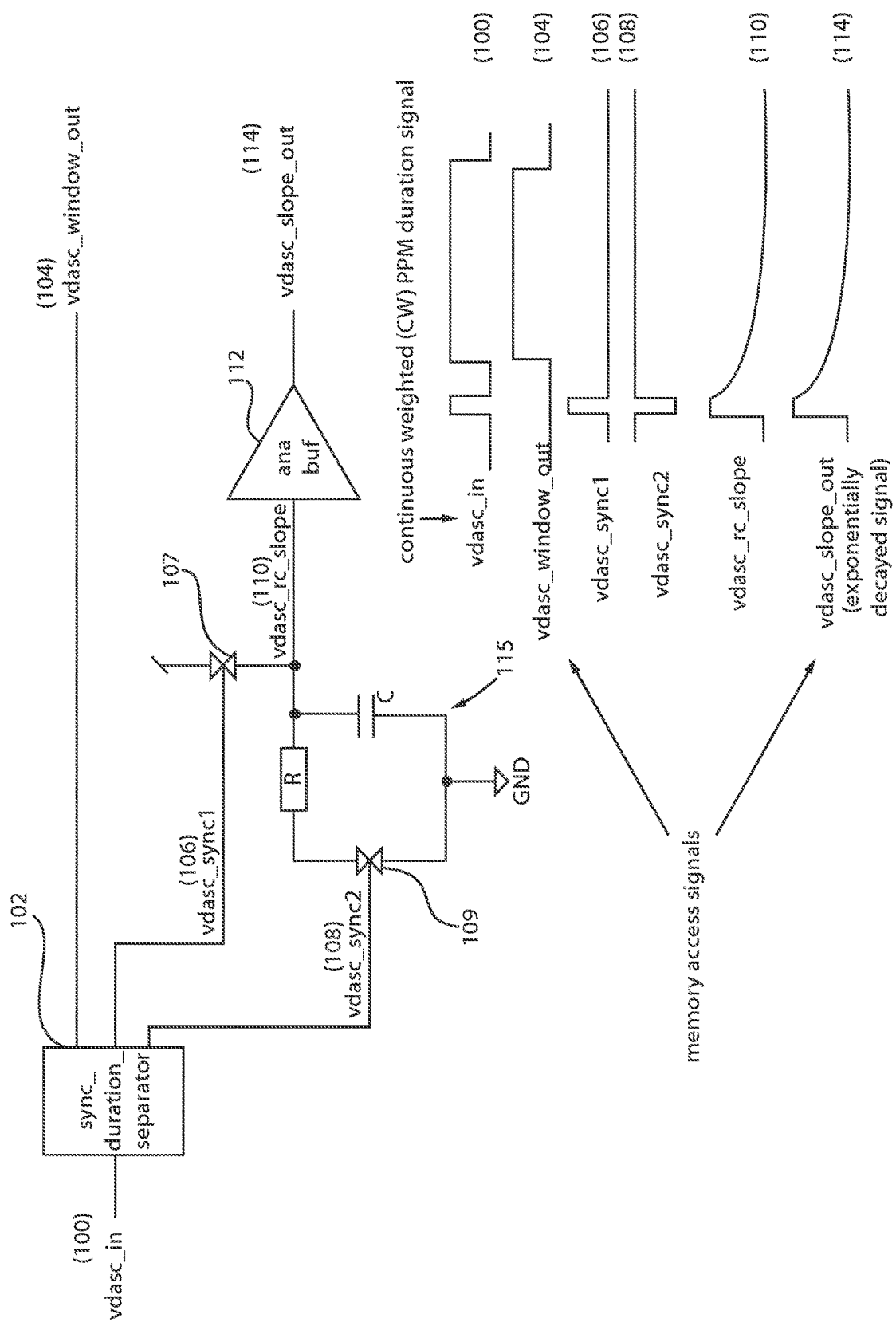
FIG. 7 is an exemplary continuous weighted PPM duration signal-to-access signals converter, in accordance with an embodiment of the present invention.

FIG. 7 is an exemplary continuous weighted PPM duration signal-to-access signals converter, in accordance with an embodiment of the present invention.

The signal vdasc_in (100) is received by a sync_duration_separator 102. The signal vdasc_in (100) is the signal (92) generated by the CW PPM duration signal generator of FIG. 6.

The sync_duration_separator 102 advantageously outputs 3 signals. The first signal is vdasc_window_out (104). The second signal, vdasc_sync1 (106), is supplied to a T-gate 107. The third signal, vdasc_sync2 (108) is supplied to a T-gate 109 in a circuit configuration 115 having a resistor "R" and a capacitor "C". The analog buffer 112 receives the signal vdasc_rc_slope (110) that is generated from the signals vdasc_sync1 (106) and vdasc_sync2 (108). The output of the analog buffer 112 is signal vdasc_slope_out (114). The waveforms of input signal vdasc_rc_slope (110) and output signal vdasc_slope_out (114) are almost same because the analog buffer 112 just drives input analog signal and generates output analog signal. The signal vdasc_slope_out (114) is an exponentially decayed signal. Thus, the signal vdasc_in (100) has been advantageously converted to a memory access signal vdasc_slope_out (114).

Figure 8:
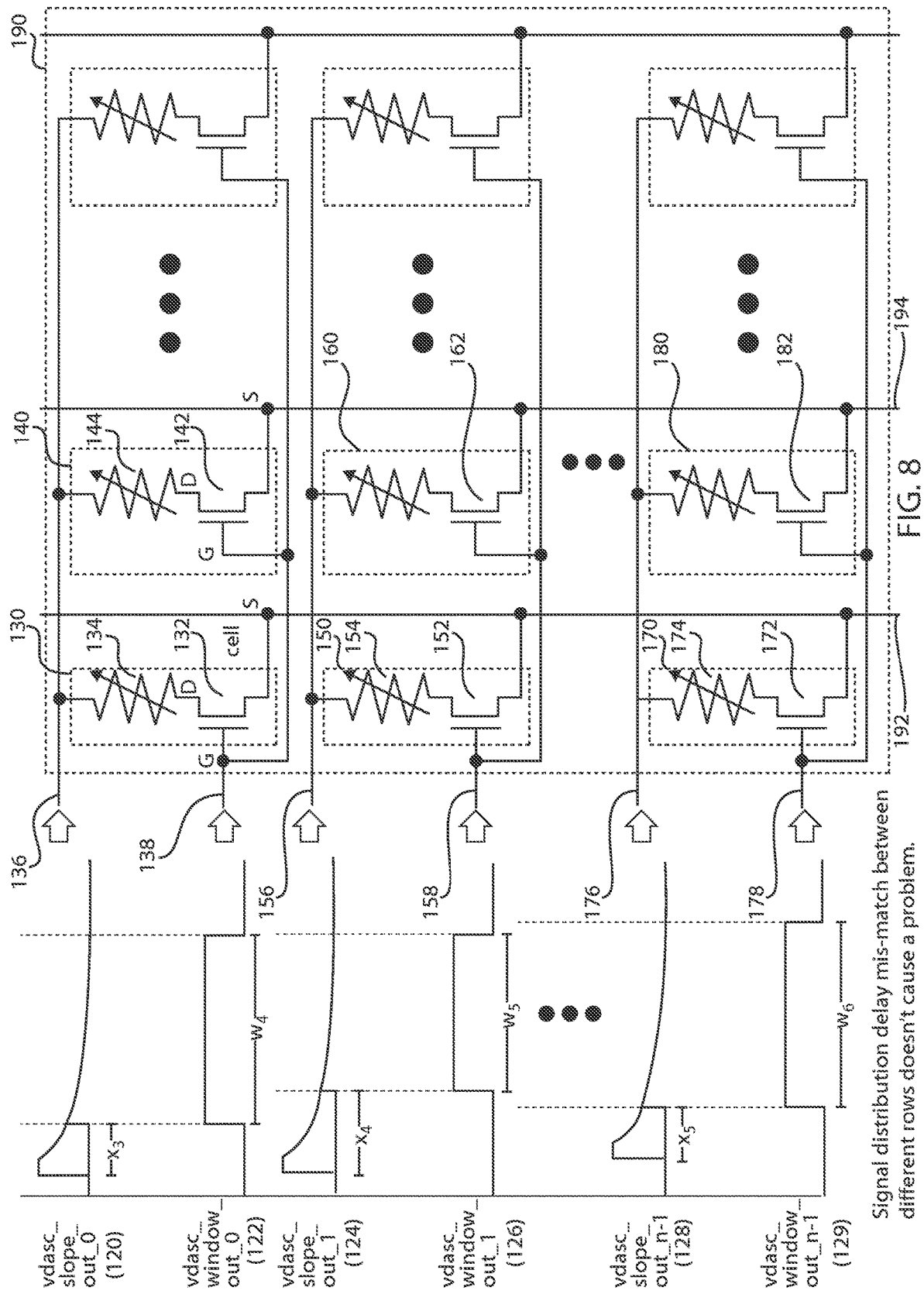
FIG. 8 is an exemplary cell and array structure with memory access signals, in accordance with an embodiment of the present invention.

FIG. 8 is an exemplary cell and array structure with memory access signals, in accordance with an embodiment of the present invention.

An array structure 190 includes a plurality of cells. A first cell 130 includes an FET 132 and a variable resistor 134. The variable resistor 134 can be connected to the drain (D) of the FET 132. The source (S) of the FET 132 can be connected to bitline 192. Bitline 192 can connect the source (S) of several FETs of various cells. For example cell 150 and cell 170 are vertically aligned with the cell 130. Cell 150 includes variable resistor 154 and FET 152 and cell 170 includes variable resistor 174 and FET 172. Similarly, cell 140 can be horizontally aligned with cell 130, cell 160 can be horizontally aligned with cell 150, and cell 180 can be horizontally aligned with cell 170. Cell 140, e.g., includes variable resistor 144 and FET 142. The source (S) of FET 140 can be connected to bitline 194. Bitline 194 can connect the source (S) of several FETs of various cells, that is, cells 160, 180.

The signal vdasc_slope_out_0 (120) is advantageously received by one of the wordlines 136 of the first series of horizontal cells 130, 140, etc. The signal vdasc_window_out_0 (122) is advantageously received by another wordline 138 which is connected to the gate of the FET 132 of cell 130 and the FET 142 of cell 140, etc. The signal 120 can be an exponentially decayed signal, whereas the signal 122 can be a pulse signal. The pulse signal can have a width $w_4$. The memory access amount can be designated by $w_4$. The vdasc_slope_out_0 (120) is full exponentially decayed signal and the vdasc_window_out_0 (122) is high during limited period ($w_4$). With these two signals, access current from memory cell 130 is proportional to the vdasc_slope_out_0 (120) level only during $w_4$ period because the FET 132 is ON when the vdasc_window_out_0 (122) is high level. In other words, no read out current comes from the cell 130 when the vdasc_window_out_0 (122) is low level.

The signal vdasc_slope_out_1 (124) is advantageously received by one of the wordlines 156 of the first series of horizontal cells 150, 160, etc. The signal vdasc_window_out_1 (126) is advantageously received by another wordline 158 which is connected to the gate of the FET 152 of cell 150 and the FET 162 of cell 160, etc. The signal 124 can be an exponentially decayed signal, whereas the signal 126 can be a pulse signal. The pulse signal can have a width $w_5$. The memory access amount can be designated by $w_5$. The vdasc_slope_out_1 (124) is full exponentially decayed signal and the vdasc_window_out_1 (126) is high during limited period ($w_5$). With these two signals, access current from memory cell 150 is proportional to the vdasc_slope_out_1 (124) level only during $w_5$ period because the FET 152 is ON when the vdasc_window_out_1 (126) is high level. In other words, no read out current comes from the cell 150 when the vdasc_window_out_1 (126) is low level.

The signal vdasc_slope_out_n−1 (128) is advantageously received by one of the wordlines 176 of the first series of horizontal cells 170, 180, etc. The signal vdasc_window_out_n−1 (129) is advantageously received by another wordline 178 which is connected to the gate of the FET 172 of cell 170 and the FET 182 of cell 189, etc. The signal 128 can be an exponentially decayed signal, whereas the signal 129 can be a pulse signal. The pulse signal can have a width $w_6$. The memory access amount can be designated by $w_6$. The vdasc_slope_out_n−1 (128) is full exponentially decayed signal and the vdasc_window_out_n−1 (129) is high during limited period ($w_6$). With these two signals, access current from memory cell 170 is proportional to the vdasc_slope_out_n−1 (128) level only during $w_6$ period because the FET 172 is ON when the vdasc_window_out_n−1 (129) is high level. In other words, no read out current comes from the cell 170 when the vdasc_window_out_n−1 (129) is low level. Thus, the vdasc_slope_out_0 (120), the vdasc_slope_out_1 (124), . . . , and the vdasc_slope_out_n−1 (128) are all same shape while the vdasc_window_out_0 (122), the vdasc_window_out_1 (124), . . . , and the vdasc_window_out_n−1 (129) are different word by word.

Therefore, data transfer can be achieved with CW PPM duration signals. Data transfer rate is a measurement of the amount of data sent between two points on a network in a given time period. It is an important concept in modern business networking, with high data transfer rates allowing networks to be used for complex tasks, such as online streaming. Understanding data transfer rate could help in improving the performance of a business's own network. Data transfer rate is commonly measured in bits-per-second (bps), with one "bit" equal to an individual binary number. This is similar to the networking concept of bandwidth, which is also measured in bps. However, transfer rate and bandwidth are two different things. Transfer rate looks at the amount of data that has actually been transferred between two different points, while bandwidth is a measurement of the theoretical maximum transfer capacity of a certain point on the network.

Every network application needs a certain amount of data to function effectively. For example, a Web browser needs to receive the necessary Web page data every time a user navigates to a new page. A low transfer rate effectively hampers the supply of this data to applications. This commonly causes slow functionality, such as reduced speed or choppy streaming. In addition, a very low transfer rate could cause some applications to stop working altogether. Some online tasks require a higher data transfer rate than others. For example, online streaming effectively requires a computer to download a new image once every fraction of a second. This consumes far more data than, say, sending an email. As such, the effects of a low data transfer rate can be seen most readily by organizations and individuals that regularly deal with data-intensive applications. The CW PPM duration signals employed herein, as described in FIGS. 1-8, can advantageously achieve fast and efficient data transfer rates.

Figure 9:
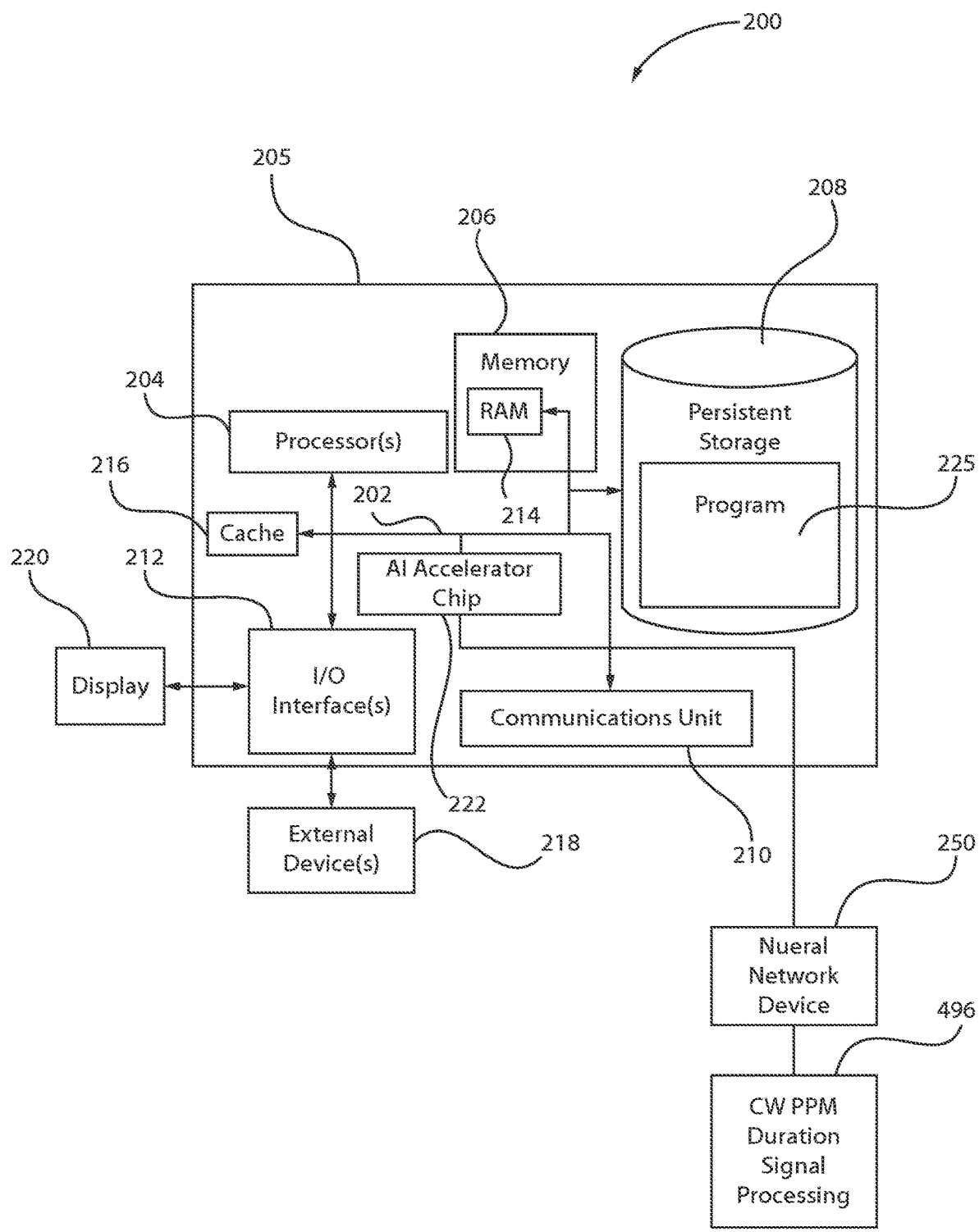
FIG. 9 is a block/flow diagram of an exemplary processing system employing the continuous weighted PPM duration scheme, in accordance with an embodiment of the present invention.

FIG. 9 is a block/flow diagram of an exemplary processing system employing the continuous weighted PPM duration scheme, in accordance with an embodiment of the present invention.

FIG. 9 depicts a block diagram of components of system 200, which includes computing device 205. It should be appreciated that FIG. 9 provides only an illustration of one implementation and does not imply any limitations with regard to the environments in which different embodiments can be implemented. Many modifications to the depicted environment can be made.

Computing device 205 includes communications fabric 202, which provides communications between computer processor(s) 204, memory 206, persistent storage 208, communications unit 210, and input/output (I/O) interface(s) 212. Communications fabric 202 can be implemented with any architecture designed for passing data and/or control information between processors (such as microprocessors, communications and network processors, etc.), system memory, peripheral devices, and any other hardware components within a system. For example, communications fabric 202 can be implemented with one or more buses.

Memory 206, cache memory 216, and persistent storage 208 are computer readable storage media. In this embodiment, memory 206 includes random access memory (RAM) 214. In another embodiment, the memory 206 can be flash memory. In general, memory 206 can include any suitable volatile or non-volatile computer readable storage media.

In some embodiments of the present invention, program 225 is included and operated by AI accelerator chip 222 as a component of computing device 205. In other embodiments, program 225 is stored in persistent storage 208 for execution by AI accelerator chip 222 in conjunction with one or more of the respective computer processors 204 via one or more memories of memory 206. The AI accelerator chip 222 can advantageously power a neural network device 250 via the CW PPM duration signal processing 496. In this embodiment, persistent storage 208 includes a magnetic hard disk drive. Alternatively, or in addition to a magnetic hard disk drive, persistent storage 208 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 208 can also be removable. For example, a removable hard drive can be used for persistent storage 208. Other examples include optical and magnetic disks, thumb drives, and smart cards that are inserted into a drive for transfer onto another computer readable storage medium that is also part of persistent storage 208.

Communications unit 210, in these examples, provides for communications with other data processing systems or devices, including resources of distributed data processing environment. In these examples, communications unit 210 includes one or more network interface cards. Communications unit 210 can provide communications through the use of either or both physical and wireless communications links. Deep learning program 225 can be downloaded to persistent storage 208 through communications unit 210.

I/O interface(s) 212 allows for input and output of data with other devices that can be connected to computing system 200. For example, I/O interface 212 can provide a connection to external devices 218 such as a keyboard, keypad, a touch screen, and/or some other suitable input device. External devices 218 can also include portable computer readable storage media such as, for example, thumb drives, portable optical or magnetic disks, and memory cards.

Display 220 provides a mechanism to display data to a user and can be, for example, a computer monitor.

Figure 10:
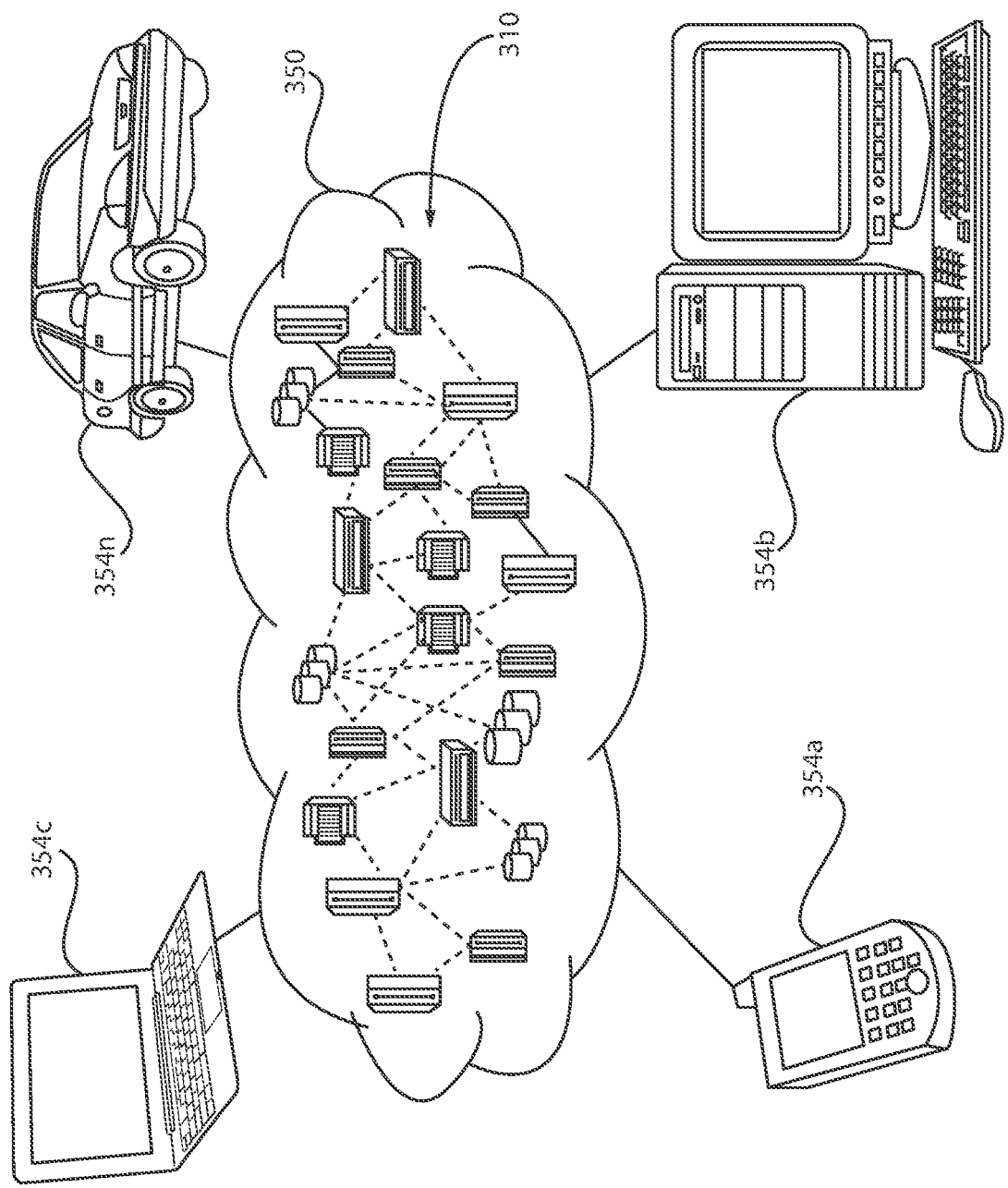
FIG. 10 is a block/flow diagram of an exemplary cloud computing environment, in accordance with an embodiment of the present invention.

FIG. 10 is a block/flow diagram of an exemplary cloud computing environment, in accordance with an embodiment of the present invention.

It is to be understood that although this invention includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model can include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but can be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It can be managed by the organization or a third party and can exist on-premises or off-premises.

Community cloud: the cloud infrastructure is shared by several organizations and supports a specific community that has shared concerns (e.g., mission, security requirements, policy, and compliance considerations). It can be managed by the organizations or a third party and can exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Referring now to FIG. 10, illustrative cloud computing environment 350 is depicted for enabling use cases of the present invention. As shown, cloud computing environment 350 includes one or more cloud computing nodes 310 with which local computing devices used by cloud consumers, such as, for example, personal digital assistant (PDA) or cellular telephone 354a, desktop computer 354b, laptop computer 354c, and/or automobile computer system 354n can communicate. Nodes 310 can communicate with one another. They can be grouped (not shown) physically or virtually, in one or more networks, such as Private, Community, Public, or Hybrid clouds as described hereinabove, or a combination thereof. This allows cloud computing environment 350 to offer infrastructure, platforms and/or software as services for which a cloud consumer does not need to maintain resources on a local computing device. It is understood that the types of computing devices 354a-n shown in FIG. 10 are intended to be illustrative only and that computing nodes 310 and cloud computing environment 350 can communicate with any type of computerized device over any type of network and/or network addressable connection (e.g., using a web browser).

Figure 11:
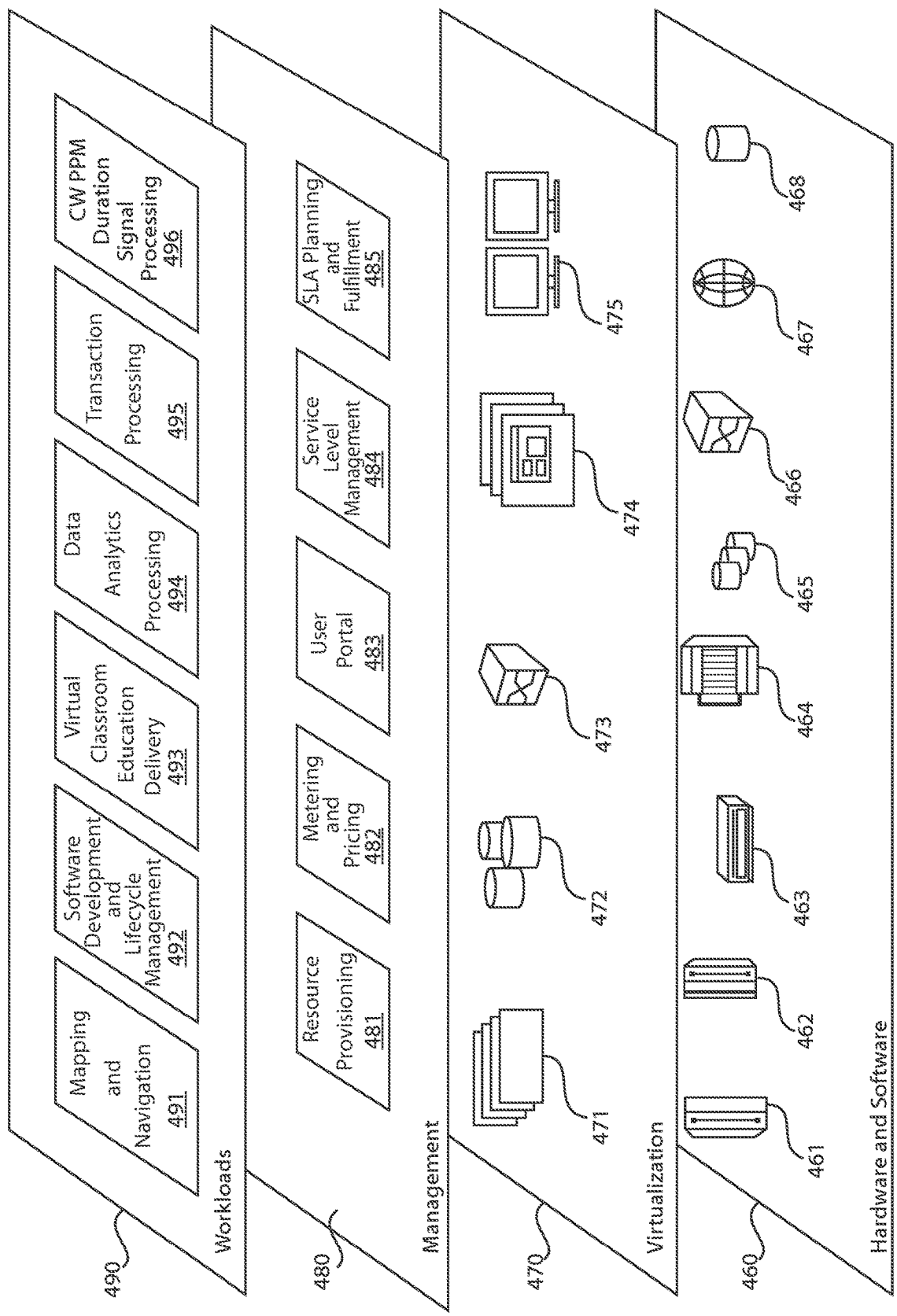
FIG. 11 is a schematic diagram of exemplary abstraction model layers, in accordance with an embodiment of the present invention.

FIG. 11 is a schematic diagram of exemplary abstraction model layers, in accordance with an embodiment of the present invention. It should be understood in advance that the components, layers, and functions shown in FIG. 11 are intended to be illustrative only and embodiments of the invention are not limited thereto. As depicted, the following layers and corresponding functions are provided:

Hardware and software layer 460 includes hardware and software components. Examples of hardware components include: mainframes 461; RISC (Reduced Instruction Set Computer) architecture based servers 462; servers 463; blade servers 464; storage devices 465; and networks and networking components 466. In some embodiments, software components include network application server software 467 and database software 468.

Virtualization layer 470 provides an abstraction layer from which the following examples of virtual entities can be provided: virtual servers 471; virtual storage 472; virtual networks 473, including virtual private networks; virtual applications and operating systems 474; and virtual clients 475.

In one example, management layer 480 can provide the functions described below. Resource provisioning 481 provides dynamic procurement of computing resources and other resources that are utilized to perform tasks within the cloud computing environment. Metering and Pricing 482 provide cost tracking as resources are utilized within the cloud computing environment, and billing or invoicing for consumption of these resources. In one example, these resources can include application software licenses. Security provides identity verification for cloud consumers and tasks, as well as protection for data and other resources. User portal 483 provides access to the cloud computing environment for consumers and system administrators. Service level management 484 provides cloud computing resource allocation and management such that required service levels are met. Service Level Agreement (SLA) planning and fulfillment 485 provide pre-arrangement for, and procurement of, cloud computing resources for which a future requirement is anticipated in accordance with an SLA.

Workloads layer 490 provides examples of functionality for which the cloud computing environment can be utilized. Examples of workloads and functions which can be provided from this layer include: mapping and navigation 491; software development and lifecycle management 492; virtual classroom education delivery 493; data analytics processing 494; transaction processing 495; and CW PPM duration signal processing 496.

Figure 12:
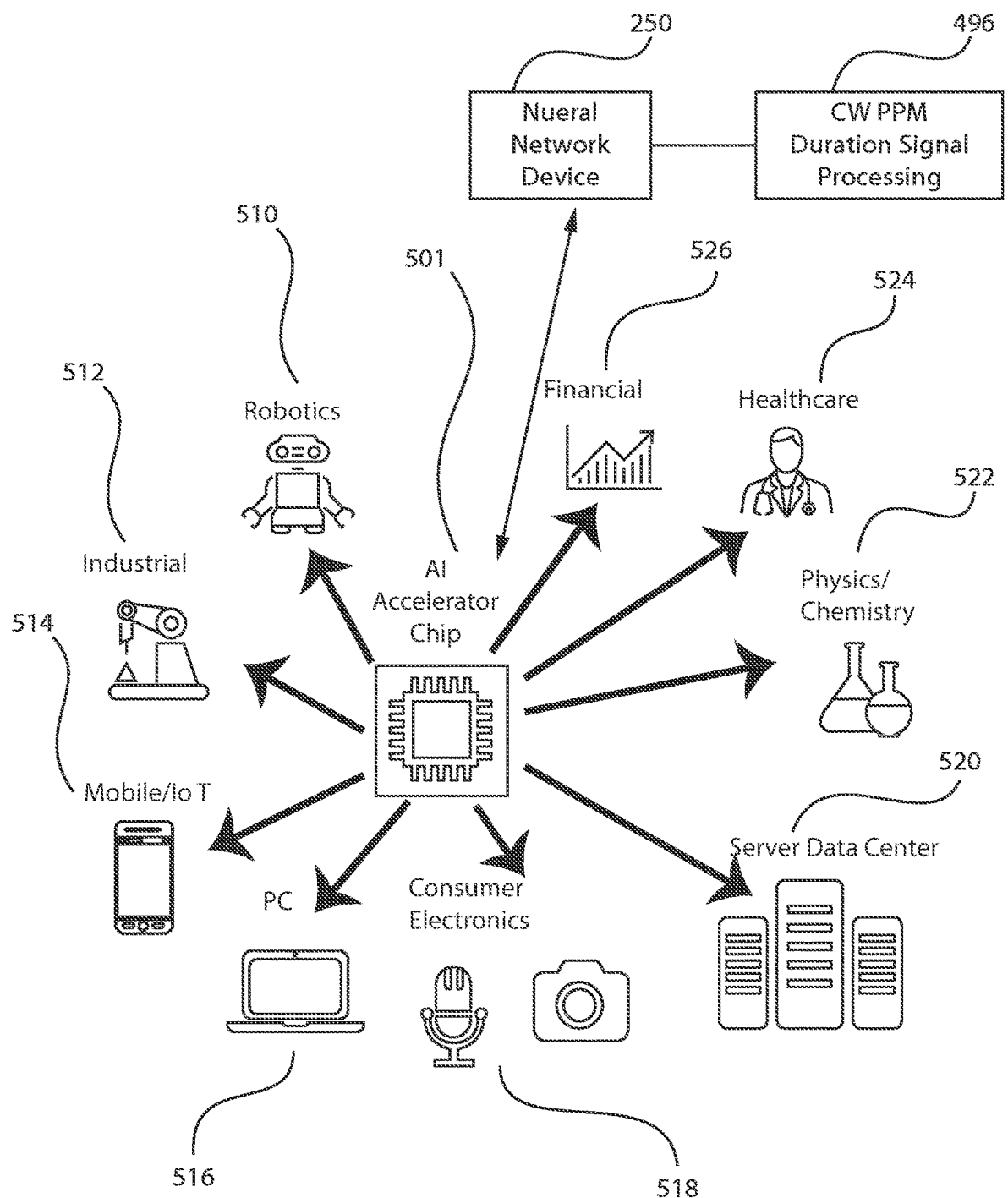
FIG. 12 illustrates practical applications for employing the continuous weighted PPM duration scheme, in accordance with an embodiment of the present invention.

FIG. 12 illustrates practical applications for employing the continuous weighted PPM duration scheme, in accordance with an embodiment of the present invention.

The artificial intelligence (AI) accelerator chip 501 can implement or power the neural network device 250 via the CW PPM duration signal processing 496, and can be used in a wide variety of practical applications, including, but not limited to, robotics 510, industrial applications 512, mobile or Internet-of-Things (IoT) 514, personal computer 516, consumer electronics 518, server data centers 520, physics and chemistry applications 522, healthcare applications 524, and financial applications 526.

For example, Robotic Process Automation or RPA 510 enables organizations to automate tasks, streamline processes, increase employee productivity, and ultimately deliver satisfying customer experiences. Through the use of RPA 510, a robot can perform high volume repetitive tasks, freeing the company's resources to work on higher value activities. An RPA Robot 510 emulates a person executing manual repetitive tasks, making decisions based on a defined set of rules, and integrating with existing applications. All of this while maintaining compliance, reducing errors, and improving customer experience and employee engagement.

Figure 13:
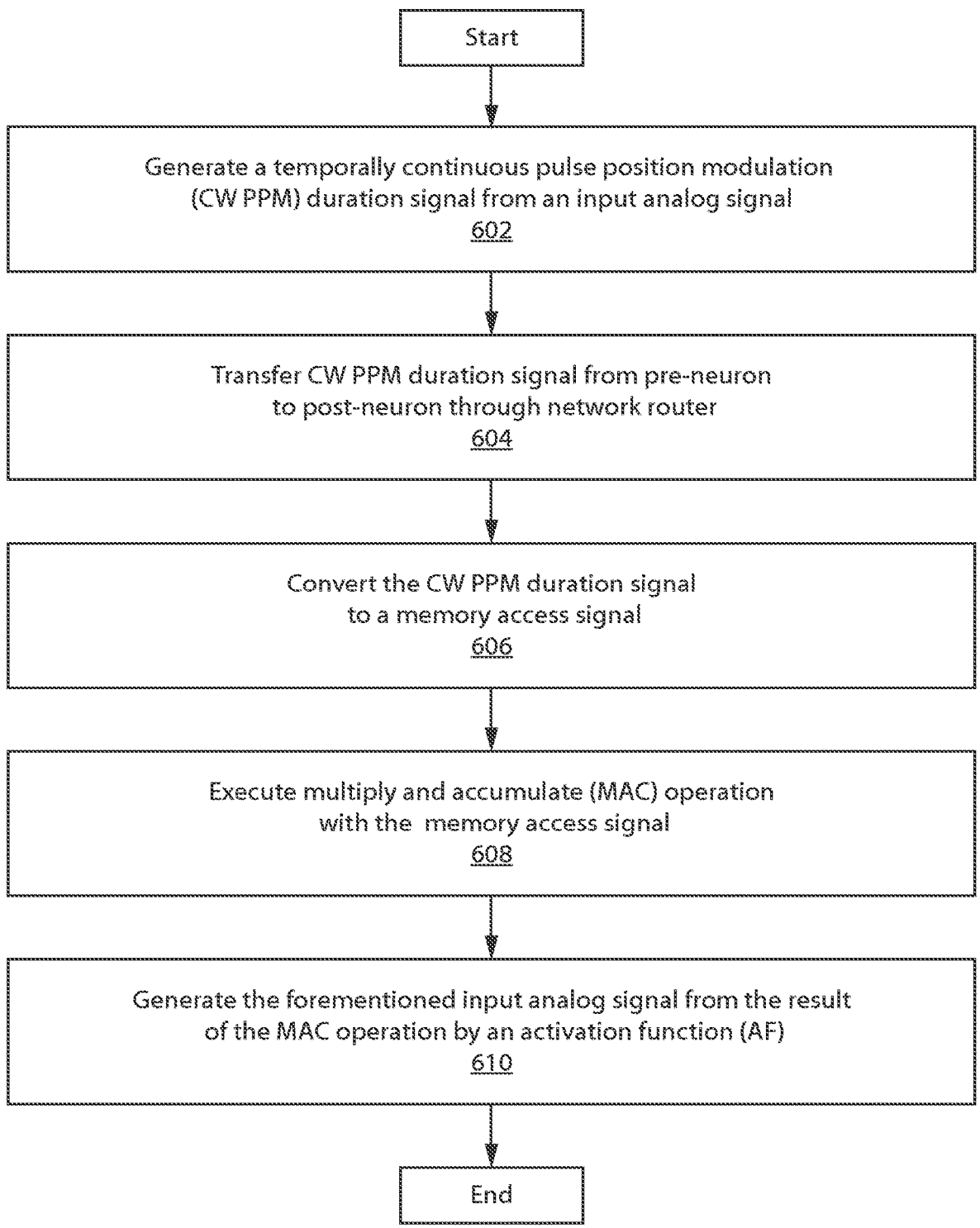
FIG. 13 is a block/flow diagram of an exemplary method for employing the continuous weighted PPM duration scheme, in accordance with an embodiment of the present invention.

FIG. 13 is a block/flow diagram of an exemplary method for employing the continuous weighted PPM duration scheme, in accordance with an embodiment of the present invention.

At block 602, generate a temporally continuous weighted pulse position modulation (CW PPM) duration signal from an input analog signal.

At block 604, transfer the CW PPM duration signal from pre-neuron to post-neuron through a network router.

At block 606, convert the CW PPM duration signal to a memory access signal.

At block 608, execute multiply and accumulate (MAC) operation with the memory access signal.

At block 610, generate the forementioned input analog signal from the result of the MAC operation by an activation function (AF).

The present invention can be a system, a method, and/or a computer program product. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory, a read-only memory, an erasable programmable read-only memory (EPROM or Flash memory), a static random access memory, a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to at least one processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks or modules. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks or modules.

The computer readable program instructions can also be loaded onto a computer, other programmable data processing apparatus, or other device to cause a series of operational blocks/steps to be performed on the computer, other programmable apparatus or other device to produce a computer implemented process, such that the instructions which execute on the computer, other programmable apparatus, or other device implement the functions/acts specified in the flowchart and/or block diagram block or blocks or modules.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the blocks can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

Having described preferred embodiments of a method for data transfer with continuous weighted pulse position modulation (PPM) duration signals (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A computer-implemented method for processing signals, the method comprising:
generating a temporally continuous weighted pulse position modulation (CW PPM) duration signal from an input analog signal;
converting the CW PPM duration signal to a memory access signal;
executing a multiply and accumulate (MAC) operation with the memory access signal; and
generating the input analog signal from a result of the MAC operation by an activation function (AF).

2. The computer-implemented method of claim 1, wherein the CW PPM duration signal is transferred from a pre-neuron to a post-neuron through a network router.

3. The computer-implemented method of claim 1, wherein the CW PPM duration signal is an exponential decay weighted signal.

4. The computer-implemented method of claim 3, wherein the exponential decay weighted signal is based on a time from when a synchronization pulse is added just before the exponential decay weighted signal.

5. The computer-implemented method of claim 1, further comprising repeating each of the steps by using the CW PPM duration signal generated from the input analog value which is an output of the MAC and the AF.

6. The computer-implemented method of claim 1, wherein the CW PPM duration signal allows for data transfer by shortening a duration pulse.

7. The computer-implemented method of claim 1, wherein the memory access signal is separated into a slope signal and a window signal.

8. The computer-implemented method of claim 7, wherein the slope signal and the window signal determine a memory access amount for controlling data transfer.

9. A computer program product for processing signals, the computer program product comprising a computer readable storage medium having program instructions embodied therewith, the program instructions executable by a computer to cause the computer to:
generate a temporally continuous weighted pulse position modulation (CW PPM) duration signal from an input analog signal;
convert the CW PPM duration signal to a memory access signal;
execute a multiply and accumulate (MAC) operation with the memory access signal; and
generate the input analog signal from a result of the MAC operation by an activation function (AF).

10. The computer program product of claim 9, wherein the CW PPM duration signal is transferred from a pre-neuron to a post-neuron through a network router.

11. The computer program product of claim 9, wherein the CW PPM duration signal is an exponential decay weighted signal.

12. The computer program product of claim 11, wherein the exponential decay weighted signal is based on a time from when a synchronization pulse is added just before the exponential decay weighted signal.

13. The computer program product of claim 9, wherein the CW PPM duration signal is generated from the input analog value which is an output of the MAC and the AF.

14. The computer program product of claim 9, wherein the CW PPM duration signal allows for data transfer by shortening a duration pulse.

15. The computer program product of claim 9, wherein the memory access signal is separated into a slope signal and a window signal.

16. The computer program product of claim 15, wherein the slope signal and the window signal determine a memory access amount for controlling data transfer.

17. A signal processing system for an analog neural network device, the system comprising:
a signal generator to generate a temporally continuous weighted pulse position modulation (CW PPM) duration signal from an input analog signal;
a converter to convert the CW PPM duration signal to a memory access signal;

a multiply and accumulate (MAC) operator to access memory with the memory access signal; and an activation function (AF) operator to process a result of the MAC operator and to generate the input analog signal for the signal generator.

18. The system of claim 17, wherein the CW PPM duration signal is transferred from a pre-neuron to a post-neuron through a network router.

19. The system of claim 17, wherein the CW PPM duration signal is an exponential decay weighted signal.

20. The system of claim 19, wherein the exponential decay weighted signal is based on a time from when a synchronization pulse is added just before the exponential decay weighted signal.

21. The system of claim 17, wherein the CW PPM duration signal allows for data transfer by shortening a duration pulse.

22. The system of claim 17, wherein the memory access signal is separated into a slope signal and a window signal.

23. The system of claim 22, wherein the slope signal and the window signal determine a memory access amount for controlling data transfer.

24. An array structure comprising:
   a plurality of memory cells incorporated between a plurality of bit lines and a plurality of wordlines, each memory cell including:
      a field effect transistor (FET) including a gate contact, a source contact, and a drain contact; and
      a variable resistor having one end electrically connected to the drain contact of the FET and the other end electrically connected to one of the plurality of wordlines out of two wordlines of the plurality of wordlines in one memory cell;
   wherein a slope signal is supplied to one of the plurality of wordlines and a window signal is supplied to another wordline of the plurality of wordlines which is connected to the gate contact of the FET such that the slope signal and the window signal are combined to form a memory access signal derived from a continuous weighted pulse position modulation (CW PPM) duration signal.

25. A method for constructing an array structure, the method comprising:
   incorporating a plurality of memory cells between a plurality of bit lines and a plurality of wordlines, each memory cell including:
      a field effect transistor (FET) including a gate contact, a source contact, and a drain contact; and
      a variable resistor having one end electrically connected to the drain contact of the FET and the other end electrically connected to one of the plurality of wordlines out of two wordlines of the plurality of wordlines in one memory cell; and
   supplying a slope signal to one of the plurality of wordlines and a window signal to another wordline of the plurality of wordlines which is connected to the gate contact of the FET such that the slope signal and the window signal are combined to form a memory access signal derived from a continuous weighted pulse position modulation (CW PPM) duration signal.

* * * * *